United States Patent
Lee

(10) Patent No.: US 6,194,294 B1
(45) Date of Patent: Feb. 27, 2001

(54) METHOD OF FORMING GATE ELECTRODE IN SEMICONDUCTOR DEVICE

(75) Inventor: Jin Hong Lee, Kyoungki-do (KR)

(73) Assignee: Hyundai Electronics Industries Co., Ltd., Kyoungki-do (KR)

(*) Notice: Under 35 U.S.C. 154(b), the term of this patent shall be extended for 0 days.

(21) Appl. No.: 09/466,740

(22) Filed: Dec. 17, 1999

(30) Foreign Application Priority Data

Dec. 22, 1998 (KR) .................................. 98-57068

(51) Int. Cl.$^7$ .............................................. H01L 21/3205
(52) U.S. Cl. .................. 438/585; 438/622; 438/592; 438/593; 438/657
(58) Field of Search .......................... 438/585, 622, 438/653, 592, 656, 657, 664, 655, 595, 593, 594, 682

(56) References Cited

U.S. PATENT DOCUMENTS

| | | |
|---|---|---|
| 5,411,907 | 5/1995 | Yoo et al. . |
| 5,491,099 | 2/1996 | Hsu . |
| 5,523,246 | 6/1996 | Yang . |
| 5,599,725 | 2/1997 | Dorleans et al. . |
| 5,796,151 | * 8/1998 | Hsu et al. ............................ 257/410 |
| 5,923,999 | * 7/1999 | Balasubramanyam et al. ..... 438/592 |
| 5,926,730 | * 7/1999 | Hu et al. ............................. 438/592 |
| 5,985,712 | * 11/1999 | Ooishi ................................. 438/231 |
| 5,994,192 | * 11/1999 | Chen ................................... 438/303 |
| 6,004,853 | * 12/1999 | Yang et al. .......................... 438/197 |
| 6,017,809 | * 1/2000 | Inumiya et al. ..................... 438/585 |

FOREIGN PATENT DOCUMENTS

| | | |
|---|---|---|
| 58-162064 | 9/1983 | (JP) . |
| 59-191382 | 10/1984 | (JP) . |
| 60-119780 | 6/1985 | (JP) . |
| 1283964 | 11/1989 | (JP) . |
| 374871 | 3/1991 | (JP) . |

\* cited by examiner

*Primary Examiner*—Matthew Smith
*Assistant Examiner*—V. Yersikov
(74) *Attorney, Agent, or Firm*—Selitto & Associates, P.C.

(57) ABSTRACT

A method of forming a gate electrode in a semiconductor device which can easily perform gate re-oxidation process without transforming the morphology of the gate electrode, is disclosed. According to the present invention, a gate oxide layer, a doped polysilicon layer, a barrier metal layer and a refractory metal layer are formed on a semiconductor substrate, in sequence. A hard mask is then formed on the refractory metal. Next, the refractory metal layer, the barrier metal layer and the polysilicon layer are etched using the hard mask as an etch mask to form a gate electrode. A spacer for oxidation barrier is then formed on the side wall of the gate electrode and the hard mask. Thereafter, gate re-oxidation process is performed using the spacer as an oxidation mask to form a re-oxidation layer on the substrate of both sides of the spacer. The spacer is formed of a nitride layer such as a SiON layer or a $Si_4N_3$ layer. Furthermore, the spacer is formed to the thickness of 50 to 300 Å.

12 Claims, 2 Drawing Sheets

METHOD OF FORMING GATE ELECTRODE IN SEMICONDUCTOR DEVICE

BACKGROUND OF THE INVENTION

1. Field of the Invention

The present invention relates to a method of manufacturing a semiconductor device, and more particularly to a method of forming a gate electrode having a stacked structure of a polysilicon layer and a refractory metal layer in a semiconductor device.

2. Description of the Related Art

Since a gate resistivity is important factor in the manufacture of highly integration of semiconductor device, the gate electrode is formed to a stacked structure of a polysilicon layer and a refractory metal, for reducing the gate resistivity. A tungsten(W) layer is used as the refractory metal. A barrier metal layer is also interposed between the polysilicon layer and the tungsten layer to prevent diffusion therebetween. The barrier metal layer is formed of a titanium nitride(TiN) layer or a tungsten nitride(WN) layer. Furthermore, for removing damage and residues due to the etching process and recovering the reliability of a gate oxide layer after forming the above gate electrode, gate re-oxidation process is performed.

In the gate re-oxidation process, however, the volume of the tungsten layer expands due to its fast oxidation rate, so that the morphology of the gate electrode is transformed. Therefore, it is difficult to perform ion-implantation for forming a source and a drain. Furthermore, gate resistivity increases.

To overcome the above problems, as the gate re-oxidation process, a selective oxidation process which oxidize selectively the only polysilicon layer, is suggested. However, since the selective oxidation process is performed at the high temperature, there is another problem that thermal budget occurs.

SUMMARY OF THE INVENTION

It is therefore an object of the present invention to provide a method of forming a gate electrode in a semiconductor device which can easily perform gate re-oxidation process without transforming the morphology of the gate electrode, for solving the problems in the conventional art.

To accomplish this above object, according to the present invention, a gate oxide layer, a doped polysilicon layer, a barrier metal layer and a refractory metal layer are formed on a semiconductor substrate, in sequence. A hard mask is then formed on the refractory metal. Next, the refractory metal layer, the barrier metal layer and the polysilicon layer are etched using the hard mask as an etch mask to form a gate electrode. A spacer for oxidation barrier is then formed on the side walls of the gate electrode and the hard mask. Thereafter, gate re-oxidation process is performed using the spacer as an oxidation mask to form a re-oxidation layer on the substrate of both sides of the spacer.

In this embodiment, the spacer is formed of a nitride layer such as a SiON layer or a $Si_4N_3$ layer. Furthermore, the spacer is formed to the thickness of 50 to 300 Å.

Additional object, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

Hereinafter, a preferred embodiment of the present invention will be explained with reference to accompanying drawings.

Figure 1A:
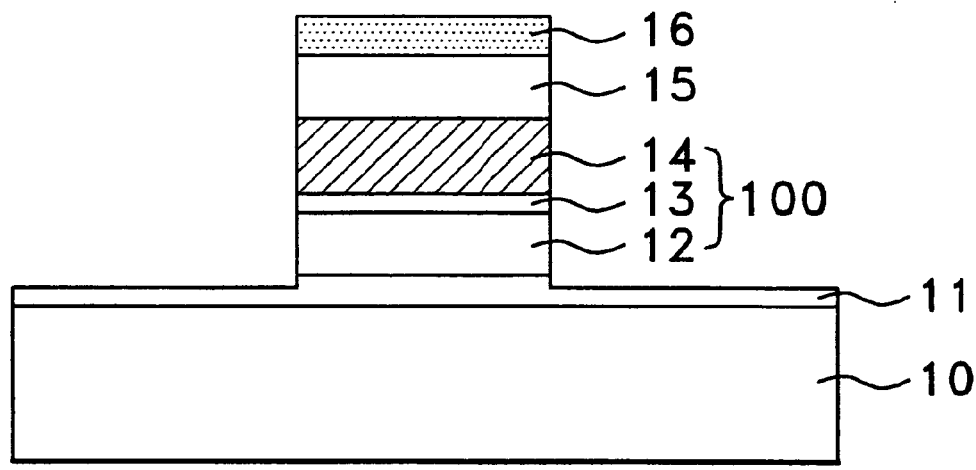
FIG. 1A to FIG. 1C are cross sectional views describing a method of forming a gate electrode in a semiconductor device according to an embodiment of the present invention.
Figure 1B:
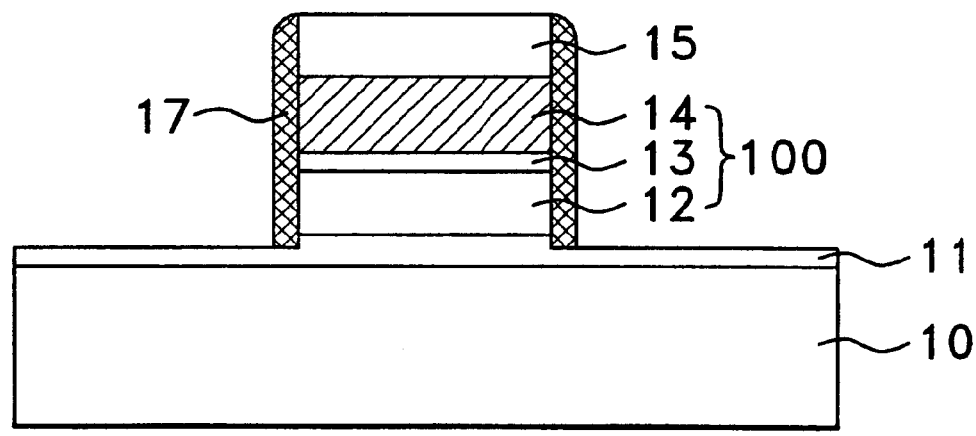
Figure 1C:
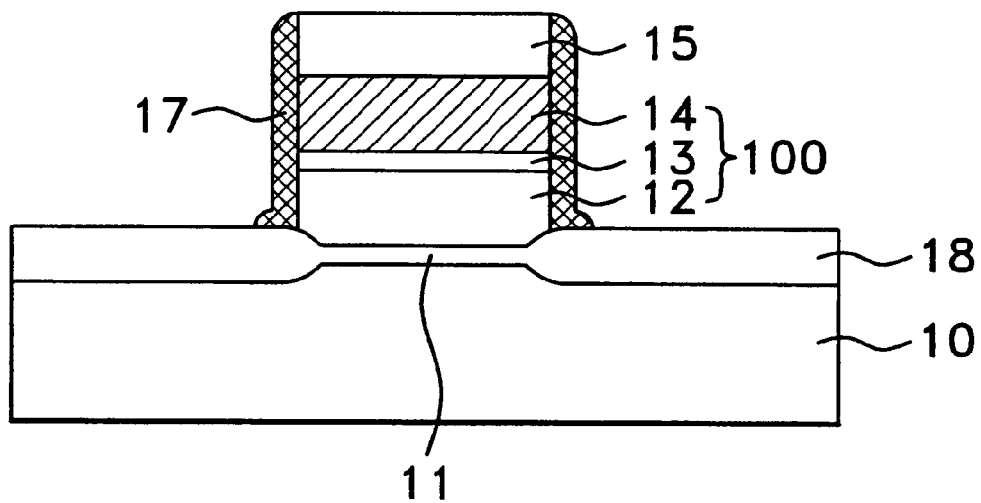

FIG. 1A to FIG. 1C are cross sectional views describing a method of forming a gate electrode in a semiconductor device according to an embodiment of the present invention.

Referring to FIG. 1A, a gate oxide layer 11 is formed in a semiconductor substrate 10 by thermal growth or deposition. A doped polysilicon layer is then formed on the gate oxide layer 11 to the thickness of 500 to 1,500 Å and a barrier metal layer 13 is formed thereon to the thickness of 50 to 200 Å. Preferably, the barrier metal layer 13 is formed of a metal nitride layer such as a tungsten nitride layer(WN) or a titanium nitride layer(TiN). A tungsten layer 14 as a refractory metal is then formed on the barrier metal layer 13 to the thickness of 500 to 1,000 Å.

Thereafter, an oxide layer is formed on the tungsten layer 14 and a photoresist pattern 16 for a gate is formed thereon by photolithography. The oxide layer is then etched using the photoresist pattern 16 as an etch mask to form a hard mask 15. Next, the tungsten layer 14, the barrier metal layer 13 and the polysilicon layer 12 are etched using the hard mask 15 as an etch mask to form a gate electrode 100. At this time, a portion of the gate oxide layer 11 is removed as a selected thickness.

Referring to FIG. 1B, the photoresist pattern 16 is removed by well known method and the resultant substrate is cleaned. An oxidation barrier layer is formed on the overall substrate to the thickness of 50 to 300 Å. Preferably, the oxidation barrier layer is formed of a nitride layer such as a SiON layer or a $Si_4N_3$ layer. Next, the oxidation barrier layer is etched so as to expose the surfaces of the gate oxide layer 11 and the hard mask 15, so that a spacer 17 for oxidation barrier is formed on the side wall of the gate electrode 100 and the hard mask 15.

Referring to FIG. 1C, for removing damage and residues due to the etching process and recovering the reliability of a gate oxide layer 11 after forming the above gate electrode 100, gate re-oxidation process is performed using the spacer 17 as an oxidation mask, so that a re-oxidation layer 18 is formed on the substrate 10 of both sides of the spacer 17. At this time, the spacer 17 prevents the tungsten layer 14 from oxidizing. Furthermore, the re-oxidation layer 18 is formed in the shape of bird's beak, as shown in FIG. 1C.

According to the present invention, when performing gate re-oxidation process, a spacer for oxidation barrier prevents a tungsten layer from oxidizing, so that the morphology of the gate electrode is not transformed. As a result, it is possible to obtain low gate resistivity and the properties and stability of a semiconductor device are improved, thereby easily accomplishing high integration of the device.

Although the preferred embodiment of this invention has been disclosed for illustrative purpose, those skilled in the art will appreciate that various modifications, additions and substitutions are possible, without departing from the scope and spirit of the invention as described in the accompanying claims.

What is claimed is:

1. A method of forming a gate electrode in a semiconductor device, comprising the steps of:

forming a gate oxide layer, a doped polysilicon layer, a barrier metal layer and a refractory metal layer on a semiconductor substrate, in sequence;

forming an oxide layer on the refractory metal layer;

etching the oxide layer using a photoresist pattern to form a hard mask;

etching the refractory metal layer, the barrier metal layer and the polysilicon layer using the hard mask as an etch mask to form a gate electrode, while removing an upper layer of the gate oxide layer on each side of the gate electrode, the gate electrode having side walls;

forming an oxidation-barrier layer over the overall substrate;

etching the oxidation-barrier layer so as to expose the gate oxide layer and the hard mask, thereby forming an oxidation-barrier spacer on the side walls of the gate electrode, the oxidation-barrier spacer extending from a top end of the hard mask to the gate oxide layer so as to cover entire side walls of the refractory metal layer, the barrier metal layer, the polysilicon layer and the hard mask; and performing a gate re-oxidation process using the oxidation-barrier spacer as an oxidation mask to form a re-oxidation layer on the substrate on each side of the gate electrode.

2. The method according to claim 1, wherein the spacer is formed of a nitride layer.

3. The method according to claim 2, wherein the spacer is an SiON layer.

4. The method according to claim 3, wherein the spacer is formed to the thickness of 50 to 300 Å.

5. The method according to claim 2, wherein the spacer is an $Si_4N_3$ layer.

6. The method according to claim 1, wherein the polysilicon layer is formed to the thickness of 500 to 1,500 Å.

7. The method according to claim 1, wherein the barrier metal layer is formed of a metal nitride layer.

8. The method according to claim 7, wherein the barrier metal layer is formed to the thickness of 50 to 200 Å.

9. The method according to claim 7, wherein the barrier metal layer is a tungsten nitride layer.

10. The method according to claim 7, wherein the barrier metal layer is a titanium nitride layer.

11. The method according to claim 1, wherein the refractory metal layer is formed of a tungsten layer.

12. The method according to claim 11, wherein the tungsten layer is formed to the thickness of 500 to 1,000 Å.

* * * * *